United States Patent [19]
Sato

[11] Patent Number: 5,849,207
[45] Date of Patent: Dec. 15, 1998

[54] METHOD FOR PLASMA ETCHING OF A PEROVSKITE OXIDE THIN FILM

[75] Inventor: Junichi Sato, Tokyo, Japan

[73] Assignee: Sony Corporation, Japan

[21] Appl. No.: 672,965

[22] Filed: Jul. 1, 1996

[30] Foreign Application Priority Data

Jul. 26, 1995 [JP] Japan .................................... 7-190566

[51] Int. Cl.⁶ ...................................................... C23F 1/12
[52] U.S. Cl. ................................ 216/76; 216/67; 216/74; 216/75; 438/722; 438/715; 438/710
[58] Field of Search ................................. 216/76, 67, 75, 216/64, 74; 438/710, 715, 722

[56] References Cited

U.S. PATENT DOCUMENTS 5,262,001 11/1993 Takehara .................................. 156/643

Primary Examiner—Marion E. McCamish
Assistant Examiner—Cheryl Juska
Attorney, Agent, or Firm—Ronald P. Kananen

[57] ABSTRACT

A method for the plasma etching of a ferrodielectric perovskite oxide thin film such as PZT which comprises providing a resist pattern from on a perovskite oxide thin film as an etching mask, and subjecting the thin film to plasma etching using an etching gas which includes a compound having at least carboxyl group in the molecule, so that the carbonyl group formed by dissociation of the compound having at least carboxyl group in the molecule reacts with constituent metals of the perovskite oxide to efficiently form a reaction product in the form of a metal complex, enabling one to effect plasma etching at a practical etching rate while ensuring good anisotropic processing.

18 Claims, 2 Drawing Sheets

FIG. IA
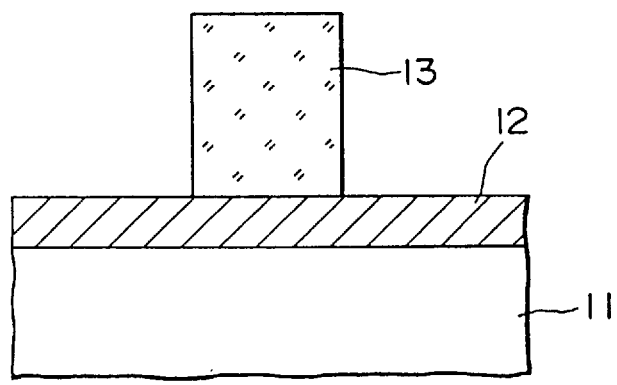
FIG. IB
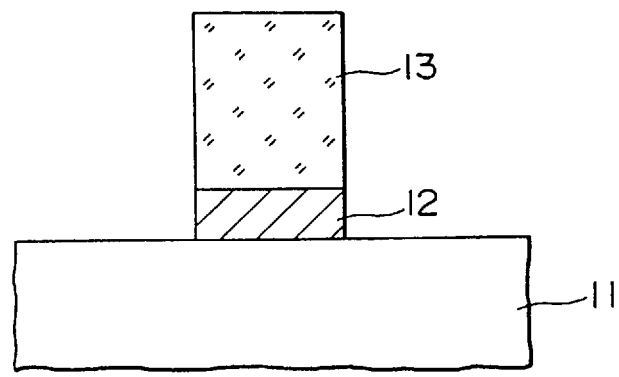
FIG. IC
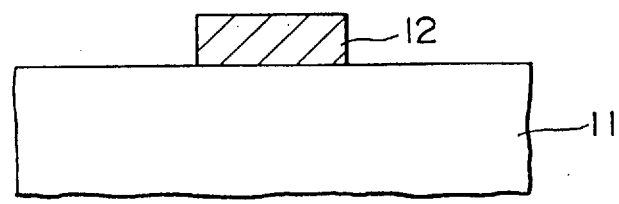

METHOD FOR PLASMA ETCHING OF A PEROVSKITE OXIDE THIN FILM

BACKGROUND OF THE INVENTION

This invention relates to a plasma etching method and more particularly, to a method for the high accuracy plasma etching of a perovskite oxide thin film to be applied to memory semiconductor devices.

A current trend in the memory hold of the next-generation memory semiconductor devices is to use, as a dielectric thin film thereof, thin films of perovskite oxides of the general formula, $ABO_3$, including lead titanate ($PbTiO_3$), PZT (Pb (Zr, Ti)$O_3$), and PLZT (Pb, La(Zr, Ti)$O_3$). It will occur to one that if utilizing ferrodielectric properties of the perovskite oxide thin films, they are applicable to as a capacitor dielectric film for charge storage of DRAM, as an MFS transistor wherein the thin film is used as an insulating film of the MIS, as a nonvolatile memory (FRAM) wherein a polarization inverting hysteresis is used, or as an IR sensor using pyro-electricity. For putting the devices using these ferrodielectric substances into practice, it is important not only how to form a ferrodielectric thin film having good characteristics, but also how to pattern the thus formed ferrodielectric thin film.

The perovskite oxide thin films have been usually patterned according to sputter etching using an inert gas such as $Ar^+$ or ion beam etching. This is because with a reactive plasma etching method using halogen chemical species, the vapor pressure of a halide of a metal which is one of components in the perovskite oxide thin film is so low that the resultant etching rate becomes too small.

In the above-mentioned etching methods which are based on the physical action, the resist pattern which is made of a masking material is sputtered at the same time, making it difficult to ensure a selective etching ratio. Another problem has been noted in that the perovskite oxide which has been removed by the sputtering is liable to be re-attached on the side faces of the pattern or the inner walls of an etching chamber, thereby causing an intended dimension to be varied and contamination with the oxide particles.

In order to overcome these problems, Japanese Patent Laid-open No. Hei 5-102093 proposes a plasma etching method wherein $H_2$ and acetyl acetone are employed as etching gases and an ECR plasma etching device is used, thereby forming a complex of constituent metals in a perovskite oxide and the acetyl acetone as a reaction product being plasma-etched. However, this method utilizes a high density plasma, so that the dissociation of the acetyl acetone with plasma proceeds excessively to an extent of the decomposition of the carbonyl group. Thus, the formation efficiency of the metal complex is low, coupled with another problem that the side walls are not protected satisfactorily. Accordingly, this method is still insufficient to achieve high-speed anisotropic plasma etching of perovskite oxide thin films.

OBJECTS AND SUMMARY OF THE INVENTION

An object of the invention is to provide a method for the plasma etching of a perovskite oxide thin film which involves a reduce variation in dimension as will be caused by re-deposition of the oxide and a reduced degree of contamination with particles while ensuring an intended ratio of selection with a resist pattern and a practically satisfactory etching rate.

According to the invention, there is provided a plasma etching method of a perovskite oxide thin film which comprises the steps of: forming a resist pattern on a perovskite oxide thin film as an etching mask; and patterning the perovskite oxide thin film by means of an etching gas which includes a compound having at least one carboxyl group in the molecule.

The compounds having at least one carboxyl group in the molecule should preferably be low carboxylic acids which can be readily charged into an etching chamber by heating.

Such compounds may be represented by the general formula, $RCH_{3-x}(COOH)_x$, wherein R represents H or an alkyl group, and x is a natural number of 1 to 3. Specific examples include monovalent lower fatty acids, and esters thereof, such as formic acid (melting point=8.4° C.), acetic acid (melting point=16.7° C.), propionic acid (melting point=140.7° C.) and butyric acid (melting point=163.5° C.), and divalent fatty acids, or esters thereof, such as oxalic acid (melting point of its dihydrate=101° to 102° C.), malonic acid (melting point=up 135° C., sublimated in vacuum). Compounds which are liquid or solid at room temperature should be vaporized by any known procedures including a bubbling-by-heating method, a burning method or a thermal sublimation method and introduced into an etching chamber.

The perovskite oxide thin film which is to be plasma etched according to the invention includes a thin film made of a material selected from lead titanate, barium titanate, strontium titanate, PZL and PLZT. The thin film may be either a single layer or a builtup layer.

The compounds having at least one carboxyl group (COOH) in the molecule are able to dissociate in a plasma thereby efficiently generating the carbonyl group (C=O) and forming a carbonyl complex by reaction with constituent metals in a perovskite oxide. Especially, when dicarboxylic acid compounds are used, two carbonyl groups are generated from one molecule of the acid, thereby ensuring efficient formation of the carbonyl complex.

The O—H and C—O bonds in the compound having at least one carboxyl group in the molecule are cut in the plasma prior to the decomposition of the C=O bond, thus leaving the C=O bond intact. From this aspect, the carbonyl complex is efficiently formed.

The thus formed carbonyl complex has a relatively high vapor pressure, so that a practically satisfactory etching rate is achieved. The carbon-based deposit formed by further decomposition of the carbonyl complex is attached to the side faces of the pattern which are less exposed to ion irradiation to form a protective film for the side walls, thus contributing to the anisotropic processing.

BRIEF DESCRIPTION OF THE DRAWINGS

FIGS. 1A to 1C, respectively, show schematic sectional views showing the etching steps of a method according to an embodiment of the invention wherein FIG. 1A shows a substrate on which a perovskite oxide film and a resist pattern are, respectively, formed in this order, FIG. 1B shows a state where the perovskite oxide thin film is plasma etched through a resist pattern mask, and FIG. 1C shows a state where the resist mask and the protective films on side walls are removed to complete a perovskite oxide thin film pattern.

DETAILED DESCRIPTION OF THE PREFERRED EMBODIMENTS

Figure 2:
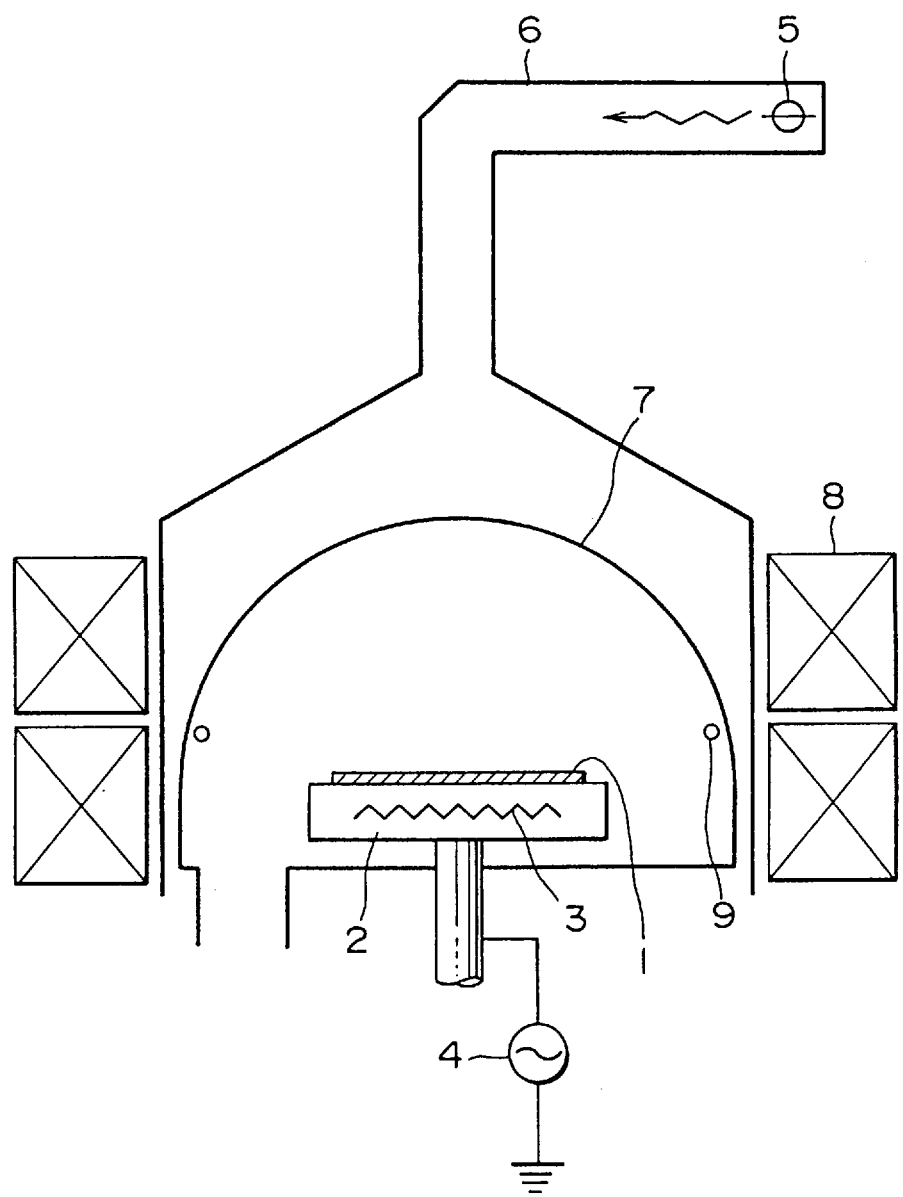
FIG. 2 is a schematic view of an ECR plasma etching of the substrate-biasing type used to carry out the method of the invention.

Embodiments of the invention are described in more detail with reference to the accompanying drawings.

First, an ECR plasma etching apparatus of the substrate-biasing type, which is used to carry out the method of the invention, is illustrated with reference to FIG. 2.

A microwave of 2.45 GHz generated from a magnetron 5 is passed via a waveguide 6 in a bell jar 7 made of a dielectric material such as quartz, alumina or the like. In the bell jar 7, an ECR plasma of an etching gas is produced by mutual action with a magnetic field of 0.0875 T generated by a solenoid coil 8. Reference numeral 9 is a ring-shaped gas charge nozzle. A substrate stage 2 mounting a substrate 1 to be etched is provided below the bell jar 7. The substrate 2 has a heater 3 for heating the substrate build therein, by which the substrate temperature can be arbitrarily controlled. The ion incident energy can be controlled by use of a substrate biasing power supply 4. In FIG. 2, some means or members of the apparatus including a clamping means for the substrate to be etched and a vacuum pump are omitted for convenience's sake.

The first example of the invention is described.

In this example, a PZT thin film is plasma etched with use of acetic acid ($CH_3COOH$). This is illustrated with reference to FIGS. 1A to 1C.

A substrate to be etched in this example is shown in FIG. 1A wherein a thin film 12 of a perovskite oxide made of PZT and a resist pattern 13 are successively formed on a substrate 11. The substrate 11 is not critical with respect to its arrangement and includes, for example, a semiconductor substrate such as, for example, Si and an insulating film such as, for example, $SiO_2$, formed on the substrate, with or without a lower electrode, such as of Pt, formed on the insulating film.

The perovskite oxide thin film 12 made of PZT is formed, for example, as having a thickness of 50 nm by reactive sputtering of multiple targets. In order to enhance the crystallinity, the thin film is annealed in an atmosphere of oxygen at about 700° C. Alternatively, the oxide thin film may be formed according to an MOCVD method using an organometallic compound as a source gas.

The substrate to be etched is placed on the substrate stage 2 of the substrate-biasing ECR plasma etching apparatus of the type shown in FIG. 2. In this example, the perovskite oxide thin film 12 exposed from the resist pattern 13 was plasma etched under the following conditions. Acetic acid was fed to the bell jar by heating its container and bubbling with a He gas.

| | |
|---|---|
| $CH_3COOH$ | 40 sccm |
| gas pressure | 1.33 Pa |
| microwave powder | 850 W (2.45 GHz) |
| Substrate biasing power | 30 W (13.56 MHz) |
| Substrate temperature | 80° C. |

In the etching step, the carbonyl group generated by dissociation of the acetic acid with the plasma formed a complex with Pb, Zr and Ti in the perovskite oxide thin film 12, and the etching proceeded while being assisted with ion incidence. At the side faces of the pattern at which the ion incidence was not so great, the reaction product was further decomposed to permit a carbon-based deposit to be attached thereto. This serves as a protective film for the side walls (not shown), thereby contributing anisotropic processing. The substrate after completion of the plasma etching is shown in FIG. 1B.

The thus etched substrate was subjected to plasma ashing to remove the resist pattern 13 and the protective film at the side walls to complete a pattern of the perovskite oxide thin film 12 as shown in FIG. 1C.

According to this example, using acetic acid as an etching gas, the perovskite oxide thin film could be anisotropically processed at a practical etching rate.

The second example of the invention is then described.

This example illustrates the plasma etching of a perovskite oxide thin film using an etching gas including malonic acid ($CH_2(COOH)_2$). This is illustrated with reference to FIGS. 1A to 1C, like the first example.

The substrate to be etched of this example is same as in the first example and is not described in detail. The substrate was placed on the substrate stage 2 of the ECR plasma etching apparatus of the substrate-biasing type shown in FIG. 2. The perovskite oxide thin film 12 was plasma etched at portions exposed from the resist pattern 13 under the following conditions, for example. Malonic acid was sublimated by heating the container therefor and was fed to the bell jar using He gas as a carrier gas. The charging pipe was heated by means of a ribbon heater to prevent solidification of the sublimated malonic acid. Ar was fed to the bell jar from a separate pipe.

| | |
|---|---|
| $CH_2(COOH)_2$ | 30 sccm |
| Ar | 10 sccm |
| gas pressure | 1.33 Pa |
| microwave powder | 850 W (2.45 GHz) |
| Substrate biasing power | 30 W (13.56 MHz) |
| Substrate temperature | 80° C. |

In this etching step, a large amount of the carbonyl group generated by dissociation of the malonic acid with the plasma formed a complex with Pb, Zr and Ti in the perovskite oxide thin film 12, and the etching proceeded while being assisted with ion incidence. At the side faces of the pattern at which the ion incidence was not so great, the reaction product was further decomposed to permit a carbon-based deposit to be attached thereto. This serves as a protective film for the side walls (not shown), thereby contributing anisotropic processing. The substrate after completion of the plasma etching is shown in FIG. 1B.

The thus etched substrate was subjected to ashing at 100° C. to remove the resist pattern 13 and the protective film on the side walls to complete a pattern of the perovskite oxide thin film 12 as shown in FIG. 1C.

According to this example, malonic acid and Ar were used as etching gases, by which the perovskite oxide thin film could be anisotropically processed at a practical etching rate.

The invention is particularly described by way of the two examples, which are illustrated only as typical ones and which should not be construed as limiting thereto the invention.

For instance, acetic acid and malonic acids were illustrated as a compound having a carboxyl group or groups in the molecule. As stated before, all organic acids of the general formula, $RCH_{3-x}(COOH)$, wherein R is H or an alkyl group and x is a natural number of 1 to 3, which exhibit, on heating, a relatively high vapor pressure sufficient to be charged into an etching chamber may likewise be used optionally. Of course, mixed gases of these compound gases with other inert gases or halogen gases may also be used.

Perovskite oxide thin films which are made, aside from PZT, of other various types of ferrodielectric materials and oxide high-temperature superconductive materials, may be likewise plasma etched.

The arrangement of the substrate to be etched and the plasma etching apparatus may, respectively, be those other than as specifically illustrated in the examples.

As will be apparent from the foregoing description, compounds having at least one carboxyl group in the molecule are used as one of etching gases in the practice of the invention, enabling one to perform the plasma etching of a perovskite oxide thin film at a reduced dimensional variation and at a reduced degree of contamination with particles while ensuring a practically satisfactory etching rate and a satisfactory selective etching ratio. According to the method of the invention, next-generation semiconductor devices utilizing ferrodielectric thin films can be reliably fabricated.

What is claimed is:

1. A method for the plasma etching of a perovskite oxide thin film comprising the steps of:

forming a resist pattern on a perovskite oxide thin film as an etching mask; and patterning said perovskite oxide thin film by means of an etching gas which includes a compound having at least one carboxyl group in the molecule.

2. A method according to claim 1, wherein said compound consists of a lower carboxylic acid which is able to be introduced into an etching chamber by heating.

3. A method according to claim 1, wherein a carrier gas for said compound consists of He gas.

4. A method according to claim 1, wherein said compound consists of acetic acid, and a temperature of a substrate on which said perovskite oxide thin film has been formed is approximately 80° C.

5. A method according to claim 1, wherein said compound consists of malonic acid, and a temperature of a substrate on which said perovskite oxide thin film has been formed is approximately 80° C.

6. A method according to claim 5, wherein a line for passing said malonic acid to a bell jar is heated to prevent solidification of said malonic acid.

7. A method according to claim 6, wherein Ar is further fed to said bell jar through a separate line.

8. A method according to claim 1, wherein said perovskite oxide thin film is made of a member selected from the group consisting of lead titanate, barium titanate, strontium titanate, PZT and PLZT.

9. A method for the plasma etching of a perovskite oxide thin film comprising the steps of:

forming a resist pattern on a perovskite oxide thin film as an etching mask; and patterning said perovskite oxide thin film by means of an etching gas which includes a compound having at least two carboxyl groups in the molecule.

10. A method according to claim 9, wherein said compound consists of a lower carboxylic acid which is able to be introduced into an etching chamber by heating.

11. A method according to claim 9, wherein a carrier gas for said compound consists of He gas.

12. A method according to claim 9, wherein said compound consists of acetic acid, and a temperature of a substrate on which said perovskite oxide thin film has been formed ins approximately 80° C.

13. A method according to claim 9, wherein said compound consists of malonic acid, and a temperature of a substrate on which said perovskite oxide thin film has been formed is approximately 80° C.

14. A method according to claim 13, wherein a line for passing said malonic acid to a bell jar is heated to prevent solidification of said malonic acid.

15. A method according to claim 14, wherein Ar is further fed to said bell jar through a separate line.

16. A method according to claim 9, wherein said perovskite oxide thin film is made of a member selected from the group consisting of lead titanate, barium titanate, strontium titanate, PZT, and PZLT.

17. A method according to claim 1 or 9, wherein said compound is mixed with at least one inert gas during said patterning step.

18. A method according to claim 17, wherein said at least one inert gas comprises Ar gas.

* * * * *